United States Patent [19]
Chang et al.

[11] Patent Number: 5,973,979
[45] Date of Patent: Oct. 26, 1999

[54] LOW SUPPLY VOLTAGE NEGATIVE CHARGE PUMP

[75] Inventors: Chung K. Chang, Sunnyvale; Johnny C. Chen, Cupertino; Lee E. Cleveland, Santa Clara, all of Calif.

[73] Assignee: Advanced Micro Devices, Inc., Sunnyvale, Calif.

[21] Appl. No.: 08/774,307

[22] Filed: Dec. 26, 1996

Related U.S. Application Data

[63] Continuation of application No. 08/559,705, Feb. 15, 1996.

[51] Int. Cl.$^6$ .................................................. G11C 13/00
[52] U.S. Cl. ...................... 365/226; 365/218; 365/185.33
[58] Field of Search ............................. 365/226, 185.33, 365/218, 149

[56] References Cited

U.S. PATENT DOCUMENTS

| | | | |
|---|---|---|---|
| 5,081,371 | 1/1992 | Wong | 307/296.2 |
| 5,394,372 | 2/1995 | Tanaka et al. | 365/226 |
| 5,400,286 | 3/1995 | Chu et al. | 365/218 |

FOREIGN PATENT DOCUMENTS

| | | |
|---|---|---|
| 0349495 | 1/1990 | European Pat. Off. . |
| 0678970 | 10/1995 | European Pat. Off. . |
| 8402607 | 7/1984 | WIPO . |

*Primary Examiner*—Terrell W. Fears
*Attorney, Agent, or Firm*—Davis Chin

[57] ABSTRACT

A low supply voltage negative charge pump for generating a relatively high negative voltage to control gates of selected memory cells via wordlines in an array of flash EEPROM memory cells during flash erasure includes charge pump means (210) formed of a plurality of charge pump stages (201–206) and coupling capacitor means (C201–C212) for delivering clock signals to the plurality of charge pump stages. Each of the plurality of charge pump stages is formed of an N-channel intrinsic pass transistor (N1–N6), an N-channel intrinsic initialization transistor (MD1–MD6), and an N-channel intrinsic precharge transistor (MX3–MX7, MX1) which are disposed in separate p-wells so as to reduce body effect. As a result, the negative charge pump is operable using a supply voltage of +3 volts or lower.

18 Claims, 3 Drawing Sheets

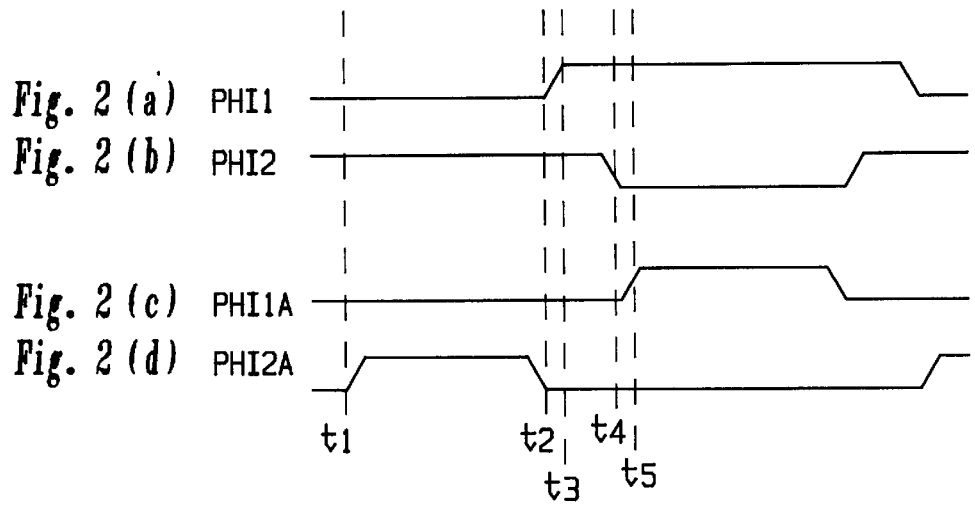
*Fig. 2(a)* PHI1
*Fig. 2(b)* PHI2
*Fig. 2(c)* PHI1A
*Fig. 2(d)* PHI2A
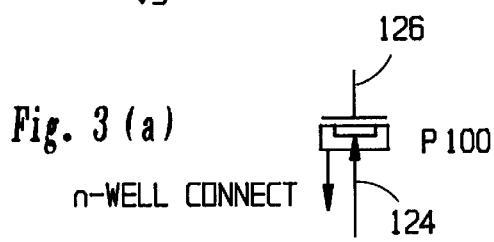
*Fig. 3(a)*
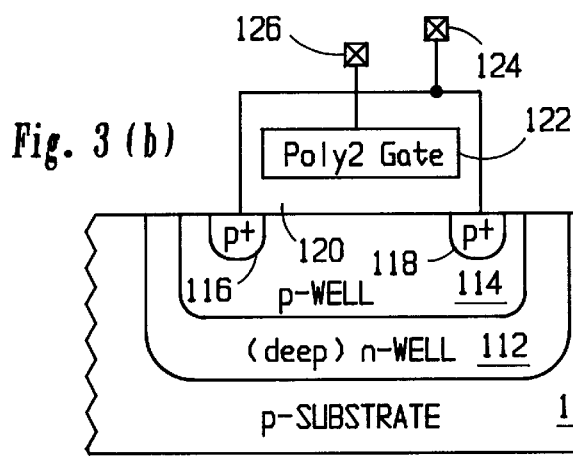
*Fig. 3(b)*
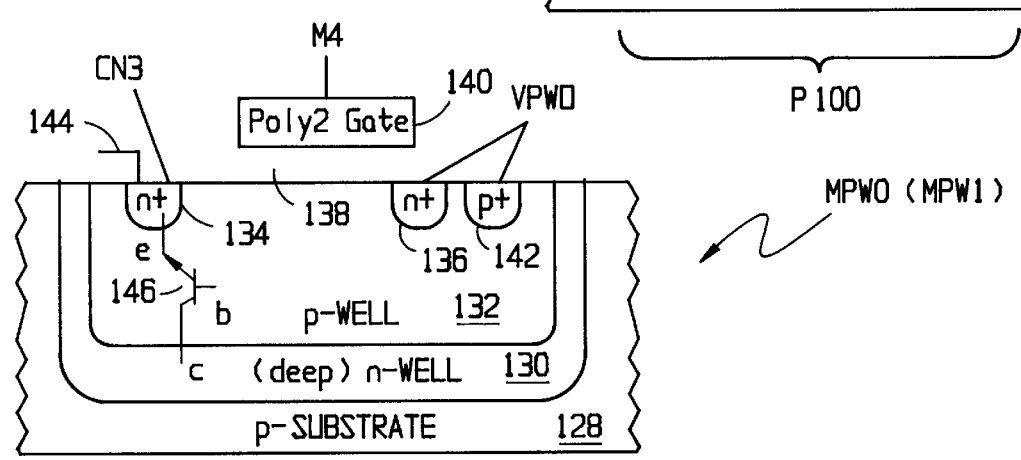
*Fig. 4*
*Fig. 5*

LOW SUPPLY VOLTAGE NEGATIVE CHARGE PUMP

This application is a continuation of application Ser. No. 08/559,705, filed Feb. 15, 1996.

BACKGROUND OF THE INVENTION

1. Field of the Invention

This invention relates generally to semiconductor integrated circuit memory devices such as flash electrically erasable programmable read-only-memory (EEPROM) devices and more particularly, it relates to an improved low supply voltage negative charge pump for generating a relatively high negative voltage to control gates of selected memory cells via wordlines in an array of flash EEPROM memory cells during flash erasure.

2. Description of the Prior Art

In U.S. Pat. No. 5,406,517 to Chung K. Chang et al. issued on Apr. 11, 1995, there is described and illustrated a distributed negative gate power supply for generating and selectively supplying a relatively high primary negative voltage to control gates of memory cells in selected half-sectors via wordlines in an array of flash EEPROM memory cells during flash erasure. The '517 patent is assigned to the same assignee as in the present invention and is hereby incorporated by reference in its entirety. In FIG. 1 of the '517 patent, there is shown a block diagram of the distributed negative gate power supply 10 which includes a separate large main pump circuit 16 and a plurality of relatively small-size, single-stage distribution sector pump circuits 18a–18p for selectively distributing the primary negative voltage NEGP.

In FIG. 2 of the '517 patent, there is shown a block diagram of the main pump circuit 16 of FIG. 1. The main pump circuit 16 includes two identical negative pumping circuits 20a and 20b which are driven by a respective clock circuit 22a and 22b for generating the relatively high primary negative voltage NEGP. The negative pumping circuit 20a is associated with the left side of the array, and the negative pumping circuit 20b is associated with the right side thereof. In FIG. 1 of the present invention, there is depicted a schematic circuit diagram of the negative pumping circuit 10, which is similar to the one in FIGS. 3(a) and 3(b) of the '517 patent.

The negative pumping circuit 10 includes four stages 12, 14, 16 and 18. An output transistor 20 is coupled to the output of the fourth stage 18 for generating the relatively high primary negative voltage NEGP on line 22, which is approximately –10.5 volts. An output buffer stage 24 is also coupled to the output of the fourth stage 18 for generating the secondary negative voltage NEGSm, which is approximately –14 volts. The input of the pumping circuit 10 is at input node "pmps." An N-channel pump-select transistor 26 has its drain connected to the input node "pmps," its gate connected to receive the erase signal ER and its source connected to the lower power supply potential VSS (ground).

The first stage 12 is formed of a P-channel pass transistor P11, a P-channel initialization transistor P12, a P-channel pre-charge transistor P13, and a pair of coupling capacitors C1, C7. The N-well of the P-channel transistors P11–P13 are connected to the upper power supply potential VPP. The coupling capacitor C1 is coupled between the node BB and an input node 28 for receiving the clock signal PHI1. The coupling capacitor C7 is coupled between the node AA and an input node 30 for receiving the clock signal PHI2A. Each of the coupling capacitors C1 and C7 is formed of a capacitor-connected P-channel MOS transistor which is operated in the inversion region.

The second stage 14 is identical in its construction to the first stage 12 and includes P-channel transistors P21, P22 and P23 and coupling capacitors C2 and C8. The N-well of the P-channel transistors P21–P23 are connected to the upper power supply potential VPP. The coupling capacitor C2 is coupled between the node D and an input node 32 for receiving the clock signal PHI2. The coupling capacitor C8 is coupled between the node B and an input node 34 for receiving the clock signal PHI1A.

The third stage 16 is likewise identical in its construction to the first stage 12 and includes P-channel transistors P31, P32 and P33 and coupling capacitors C3 and C9. The coupling capacitor C3 is connected between the node G and the input node 28 for receiving the clock signal PHI1. The coupling capacitor C9 is connected between the node E and the input node 30 for receiving the clock signal PHI2A. It will be noted that the N-well of the P-channel transistors P31, P32 and P33 are tied to the negative well voltage VNWn (approximately 0 volts during erase) rather than the supply potential VPP so as to prevent junction breakdown.

The fourth stage 18 is quite similar in its construction to the first stage 12 and includes P-channel transistors P41, P42 and P43 and coupling capacitors C4 and C10. The coupling capacitor C4 is coupled between the node J and the input node 32 for receiving the clock signal PHI2. The coupling capacitor C10 is connected between the node H and the input node 34 for receiving the clock signal PHI1A. Each of the coupling capacitors C2–C4 and C8–C10 is likewise formed of a capacitor-connected P-channel MOS transistor which is operated in the inversion region. The output transistor 20 has its source connected to the node J and its drain connected to the output line 22 for generating the negative voltage NEGP. The gate of the transistor 20 is connected to an internal node K. The N-well of the transistor 20 is also connected to the N-well voltage VNWn.

One of the disadvantages in this prior art negative pumping circuit 10 is that each of the charge pumping stages is formed of a pair of capacitor-connected P-channel MOS transistors and a P-channel pass transistor. Since the P-channel transistor devices have such a large body-effect coefficient and the back-bias (sometimes referred to as "source bias"—$V_{sb}$) is so high, the threshold voltage $V_{tp}$ can be as high as –3.0 volts when used as charge passing devices in a negative charge pump. As a result, the four-stage charge pumping circuit 10 of FIG. 1, even with the voltage threshold cancellation circuit (i.e., P12, P13 and C7 for the first stage), is thus made impractical when the power supply voltage VCC is reduced to +3.0 volts or lower, unless the clock signals themselves are pumped to a higher voltage than the power supply voltage VCC. In addition, the prior art negative pumping circuit suffers from another disadvantage due to the fact that the capacitor-connected P-channel MOS transistors are functioning as an inversion capacitor which has a higher initialization voltage.

The present invention represents a significant improvement over the prior art negative pumping circuit in the main negative pump circuit of the distributed negative gate power supply as discussed above in the '517 patent. The low supply voltage negative charge pump of the present invention is used for generating a relatively high negative voltage during flash erasure in which a supply voltage of +3.0 volts or lower is being used. The low supply voltage negative charge pump includes a plurality of charge pump stages each having an intrinsic N-channel transistor formed in separate p-wells in order to minimize the body-effect coefficient. As a result, the negative charge pump is capable of operating at lower supply voltages.

SUMMARY OF THE INVENTION

Accordingly, it is a general object of the present invention to provide an improved low supply voltage negative charge pump for generating a relatively high negative voltage which overcomes all the disadvantages of the prior art negative pumping circuits.

It is an object of the present invention to provide an improved negative charge pump for generating a relatively high primary negative voltage during flash erasure which uses supply voltages of +3.0 volts or lower.

It is another object of the present invention to provide an improved low supply voltage negative charge pump which includes a plurality of charge pump stages each having N-channel intrinsic transistors formed in separate p-wells in order to minimize the body-effect coefficient.

It is still another object of the present invention to provide an improved low supply voltage negative charge pump which includes a plurality of charge pump stages each being formed of N-channel intrinsic pass, initialization and pre-charge transistors formed in a separate p-well so as to reduce the body effect.

It is yet still another object of the present invention to provide an improved low supply voltage negative charge pump which includes a plurality of charge pump stages each having N-channel intrinsic pass transistors formed in a separate p-well and a plurality of accumulation capacitors, each being formed of a p-well capacitor.

In accordance with these aims and objectives, the present invention is concerned with the provision of a low supply voltage negative charge pump for generating a relatively high negative voltage to control gates of selected memory cells via wordlines in an array of flash EEPROM memory cells during flash erasure. The negative charge pump includes a plurality of clock signals and a charge pumping circuit responsive to an external power supply potential and to the plurality of clock signals for generating a relatively high negative voltage. The charge pumping circuit is formed of a plurality of charge pump stages.

Coupling capacitors are responsive to the plurality of clock signals and are coupled to each of the plurality of charge pump stages for delivering the clock signals to the plurality of charge pump stages. Each of the plurality of charge pump stages is formed of an N-channel intrinsic pass transistor, an N-channel intrinsic initialization transistor, and an N-channel intrinsic pre-charge transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 2(a) through 2(d) are timing diagrams of the four-phase clock signals;

FIG. 3a shows the electrical symbol for a p-well capacitor for use as an accumulation capacitor in negative charge pumps;

FIG. 3b is a cross-sectional view of the p-well capacitor of FIG. 3a, constructed in accordance with the principles of the present invention;

FIG. 4 shows the electrical symbol for an N-channel intrinsic transistor formed in a p-well region;

FIG. 5 is a cross-sectional, structural view of the N-channel intrinsic transistor of FIG. 4, constructed in accordance with the principles of the present invention.

DESCRIPTION OF THE PREFERRED EMBODIMENT

Figure 1:
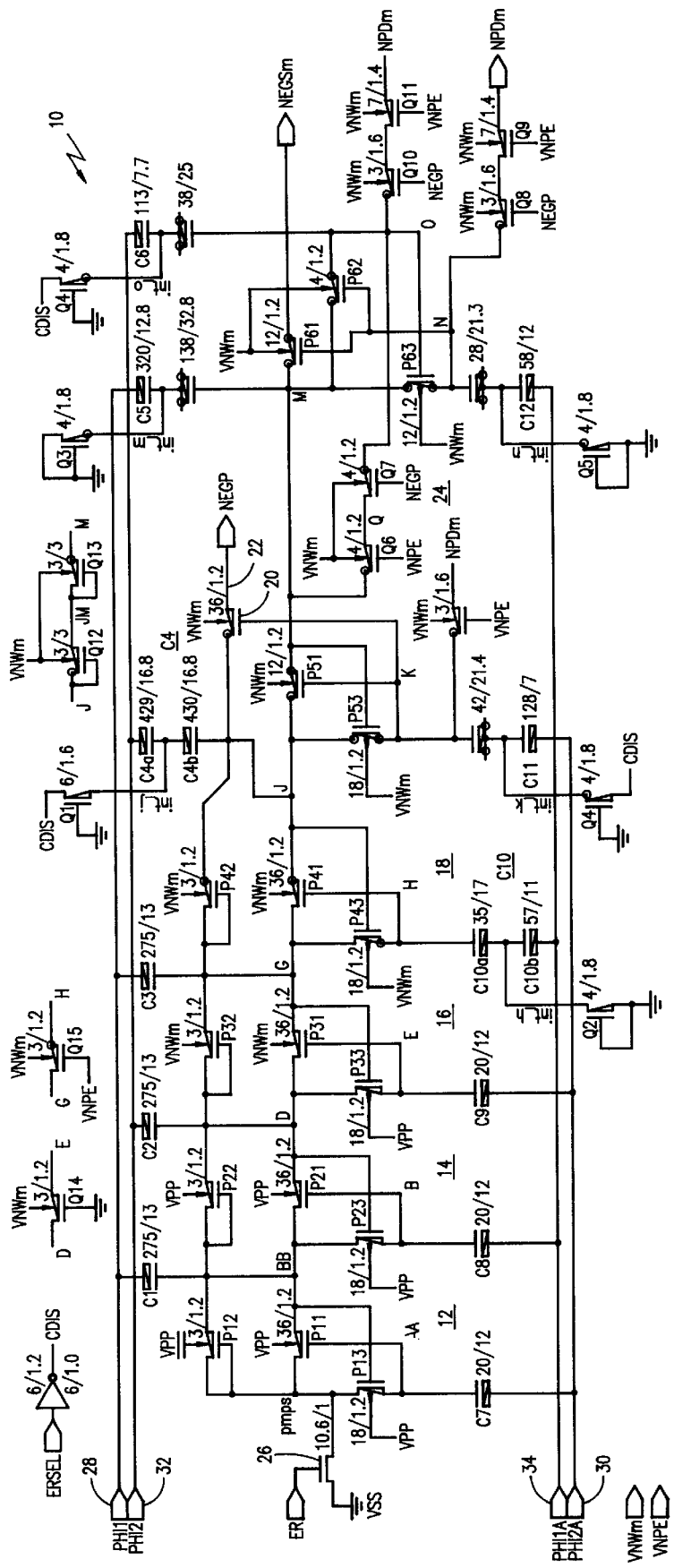
FIG. 1 is a detailed schematic circuit diagram of a prior art negative charge pumping circuit.

In the following, there will be described the preferred embodiment of the present invention with reference to the drawings. With reference to FIG. 3a of the drawings, there is depicted an electrical symbol for a p-well capacitor P100 for use as an accumulation capacitor in negative voltage charge pumps. There is shown in FIG. 3b a cross-sectional structural view of the P-well capacitor of FIG. 3a, which is constructed in accordance with the principles of the present invention. As can be seen, the reference numeral 110 designates a p-type substrate which has formed therein an n-well (deep) region 112. A p-well region 114 is, in turn, formed in the n-well region 112. There are formed a pair of p-well electrode regions 116 and 118 in the p-well region 114. A thin gate oxide region 120 is interposed between the top surface of the p-well region and a conductive polysilicon gate 122. Thus, the p-well region 114 is electrically insulated from the p-type substrate 110. The p-type well electrode regions 116 and 118 are connected together and to a metal contact connection 124 defining one plate of the p-well capacitor P100. The gate 122 is also joined to a metal contact connection 126 defining the other plate of the capacitor P100.

In FIG. 4, there is depicted an electrical symbol for an N-channel intrinsic transistor MPWO(MPW1) formed in a p-well region. There is shown in FIG. 5 a cross-sectional structural view of the N-channel intrinsic transistor MPWO (MPW1) of FIG. 4, which is constructed in accordance with the principles of the present invention. As can best be seen from FIG. 5, the reference number 128 designates a p-type substrate which has formed therein an n-well (deep) region 130. A p-well region 132 is, in turn, formed in the n-well region 130. An n-type source region 134 and an n-type drain region 136 are diffused in the surface of the p-well region 132. A thin gate oxide layer 138 is interposed between the top surface of the p-well region 132 and a conductive poly-silicon gate 140. Further, a p-well electrode region 142 is formed in the p-well region 132. The source region 134 is joined to a metal contact connection 144. The drain region 136 and the p-well electrode region 142 are joined to a well connection VPW0(VPW1) defining the p-well region 132.

It will be noted that a parasitic bipolar junction transistor 146 has been formed in the structure of the N-channel intrinsic transistor MPWO(MPW1). In particular, the n-well region 130 corresponds to the collector c, the p-well region 132 corresponds to the base b, and the n-type source region 134 corresponds to the emitter of the parasitic bipolar junction transistor 146, respectively. When the N-channel intrinsic transistors are used to form a negative charge pump, it is important to minimize the forward biasing of the n-type source (134) to p-well (132) junctions since the p-wells themselves are required to be pumped down by the negative charge pump. In order to achieve this aim, the n-well (deep) region 130 is preferably tied to a ground potential during its operation in order to minimize the collector-emitter current of the parasitic bipolar junction transistor 146.

Figure 6:
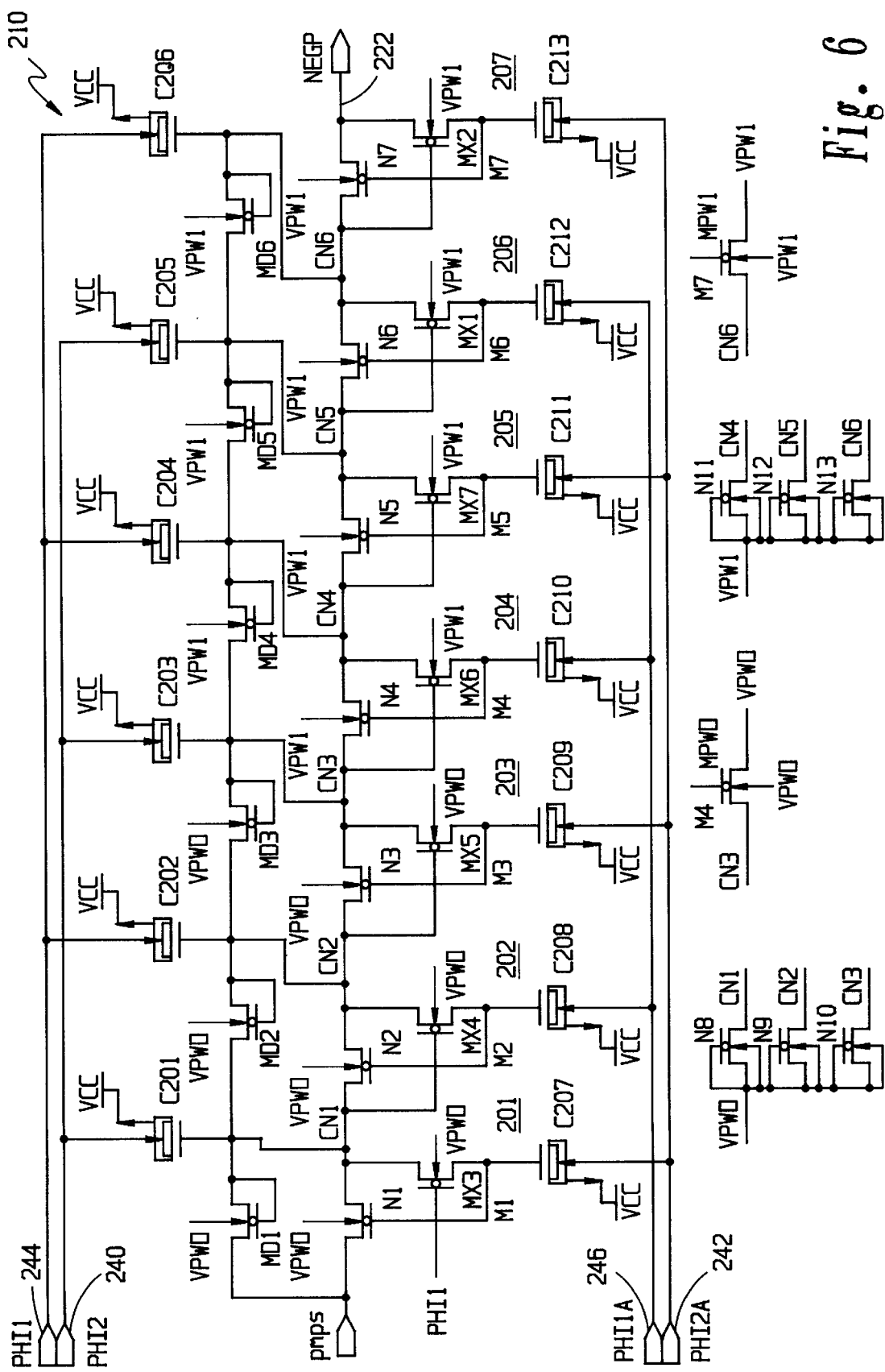
FIG. 6 is a detailed circuit diagram of a low supply voltage negative charge pump of the present invention utilizing N-channel intrinsic transistors similar to FIG. 5 and accumulation capacitors similar to FIG. 3b.

In FIG. 6, there is illustrated a detailed circuit diagram of a low supply voltage negative charge pump 210 for generating a relatively high negative voltage to control gates of selective memory cells via wordlines in an array of flash EEPROM memory cells during flash erasure, constructed in accordance with the principles of the present invention. By comparing the low supply voltage pump 210 of FIG. 6 with the prior art negative pumping circuit 10 of FIG. 1, it can be seen that they are quite similar in structure. The pump 210 includes six stages 201, 202, 203, 204, 205 and 206 rather than the four stages of the pump circuit 10. An output buffer stage 207 is coupled to the output of the sixth stage 206 for generating the relatively high primary negative voltage NEGP on the output line 222. This is because the pump 210 has been designed to operate with a lower supply voltage, such as +3.0 volts or lower to approximately +2.5 V. Thus, more stages are needed to pump up the lower supply voltage to be at the same high negative voltage NEGP on the output line 222, which is approximately −9.5 volts. The pump 210 is turned on when a pump select transistor (not shown) is rendered conductive in response to an erase signal so as to cause the input node "pmps" to be connected to a ground potential.

As previously pointed out, the prior art pumping circuit 10 suffers from the disadvantage of using P-channel MOS transistors as the pass transistors which has a large body-effect coefficient and the back-bias (source bias) is so high. Therefore, the threshold voltages of the pass transistors in the pumping circuit 10 can be as large as −3.0 V which renders impractical the use of a lower supply voltage since the pumping circuit ceases to function when the voltage swing of the clock signals approaches that of the threshold voltage. The inventors have developed a technique of reducing the body-effect of the pass transistors so as to be capable of operating the charge pump at a low supply voltage. This is accomplished in the present invention by utilizing N-channel intrinsic transistors formed in a separate p-well, which have a nominal lower threshold voltage of about 0.3 V, rather than using the P-channel transistors. As can be seen from FIG. 6, this is the major difference between the present invention and the prior art of FIG. 1. Further, it will be noted that the p-well has been split or divided into two different p-wells in order to reduce the source bias and thus the body-effect.

It should be apparent to those skilled in the art that the p-well could be divided even further (i.e., such as a separate p-well for each pump stage) in order to further reduce the body-effect and thus permit the operation of the charge pump at an even lower supply voltage. However, this method has the disadvantage of requiring an increased amount of area occupied on a semiconductor chip which, in turn, increases the overall size of the charge pump as well as adding to its complexity. It should be appreciated that only two separate p-wells have been used in the present negative charge pump 210.

Another difference between the present charge pump 210 and the prior art is that the p-well capacitor functioning as an accumulation capacitor are utilized rather than capacitor-connected P-channel MOS transistors operating in the inversion region. The p-well capacitors have the advantage of being able to be turned on at a smaller voltage $V_{gs}$ (gate-to-source) than the P-channel transistors. As a consequence, they can transfer more charge during the start-up of the pump and thus facilitate a faster pumping down of the external power supply voltage VCC to the negative voltage NEGP.

The first pump stage 201 is formed of an N-channel pass transistor N1, an N-channel initialization transistor MD1, and an N-channel pre-charge transistor MX3 and a pair of coupling capacitors C201, C207. Unlike the first stage 12 of the prior art in FIG. 1, each of the transistors N1, MD1 and MX3 is formed as an N-channel intrinsic transistor formed in a p-well (similar to FIG. 5) rather than as a P-channel transistor. Also, each of the coupling capacitors C201, C207 of the first pump stage 201 is formed as a p-well capacitor (similar to FIG. 3b) operating in the accumulation region rather than as capacitor-connected P-channel MOS transistors operating in the inversion region.

The intrinsic pass transistor N1 has its source connected to the input node "pmps," its drain connected to an output/input node CN1, and its gate connected to an internal node M1. The intrinsic initialization transistor MD1 is a diode-connected transistor in which its drain and gate are connected together and to the drain of the intrinsic pass transistor N1 and to the source of the intrinsic pre-charge transistor MX3. The source of the intrinsic initialization transistor MD1 is connected to the source of the transistor N1. The transistor MX3 has its drain connected to the internal node M1 and to the gate of the transistor N1. The transistor MX3 has its source connected to the drain of the transistor N1. The p-wells of the transistors N1, MD1 and MX3 are connected to a first p-well connection area VPW0. The p-well coupling capacitor C201 is coupled between the output node CN1 and an input node 240 for receiving a clock signal PHI2. The p-well coupling capacitor C207 is coupled between the internal node M1 and an input node 242 for receiving a clock signal PHI2A.

The second pump stage 202 is identical in its construction to the first stage 201 and includes N-channel intrinsic transistors N2, MD2 and MX4 and p-well coupling capacitors C202 and C208. The input of the second stage 202 is at the output/input node CN1 and the output thereof is at the output/input node CN2. The p-well coupling capacitor C202 is coupled between the output node CN2 and an input node 244 for receiving a clock signal PHI1. The p-well coupling capacitor C208 is coupled between the internal node M2 and an input node 246 for receiving a clock signal PHI1A. The third pump stage 203 is likewise identical in its construction to the first stage 201 and includes N-channel intrinsic transistors N3, MD3 and MX5 and p-well coupling capacitors C203 and C209. The input of the third stage 203 is at the node CN2, and the output thereof is at the output/input node CN3. The coupling capacitor C203 is coupled between the output node CN3 and the input node 240 for receiving the clock signal PHI2. The capacitor 209 is coupled between the internal node M3 and the input node 242 for receiving the clock signal PHI2A. As will be recalled, in order to reduce the source bias and thus the body-effect, all of the intrinsic transistors in the second and third stages are formed in the same p-well of the first stage and are thus tied to the first p-well connection area VPW0.

The fourth, fifth and sixth pump stages 204, 205 and 206 are all identical and are also quite similar in their construction to the first stage 201. The fourth-sixth pump stages include corresponding N-channel intrinsic transistors N4, MD4, and MX6; N5, MD5, and MX7; N6, MD6, and MX8, and corresponding p-well coupling capacitors C204–C206 and C210–C212. The only difference is that the N-channel intrinsic transistors in the fourth-sixth stages are all formed in a separate p-well defined by a second p-well connection area VPW1 so as to reduce the body-effect.

The output stage 207 includes an N-channel intrinsic pass transistor N7, an N-channel intrinsic pre-charge transistor MX2 and a p-well coupling capacitor C213. The pass transistor N7 has its source connected to the output node CN6 and its drain connected to the output line 222 for generating the relatively high primary negative voltage NEGP. The p-well of the transistor N7 and MX2 are also tied to the second p-well contact area VPW1.

Three N-channel intrinsic transistors N8, N9 and N10 are diode-connected transistors which are connected in parallel. The gate and drain of each of the transistors N8–N10 are connected together and to the first p-well connection area VPW0. The source of the transistors N8–N10 are connected to the output/input nodes CN1–CN3, respectively. Similarly, there are three intrinsic transistors N11, N12 and N13 which are diode-connected transistors connected in parallel. The gate and drain of each of the transistors N11–N13 are connected together and to the second p-well connection area VPW1. The source of the transistors N11–N13 are connected to the output/input nodes CN4–CN6, respectively. Further, there is provided an N-channel intrinsic equalization transistor MPW0 having its source connected to the node CN3, its drain connected to the first p-well connection area VPW0 and its gate connected to the node M4.

Likewise, there is provided an N-channel intrinsic equalization transistor MPW1 having its source connected to the node CN6, its drain connected to the second p-well connection area VPW1 and its gate connected to the node M7. These equalization transistors MPW0 and MPW1 serve to minimize the possibility of the base-emitter junction of the parasitic bipolar junction transistor from becoming forward biased.

The operation of the low supply voltage negative charge pump 210 depicted in FIG. 6 will now be described with reference to the waveforms of the fourphase clock signals in FIGS. 2(a)–2(d). With reference to the first charge pump stage 201, the negative charge pump 210 is started by pulling the input node pmps to a ground potential via a select transistor (not shown). It will be assumed that prior to the start of the operational cycle (i.e., before the time t1 in FIG. 2) the clock signal PHI2 is at the high level (+3.0 volts). Therefore, when the input node "pmps" is pulled low (0 volts), the initialization transistor MD1 will cause the node CN1 to be one threshold voltage drop above the node "pmps" or at approximately +1 volt. Further, the pre-charge transistor MX3 will be turned off since the clock signal PHI1 is at a low level (0 volts) and it will be assumed that the node M1 starts off at ground (0 volts). Thus, prior to the time t1, the transistor MD1 is turned on slightly, but both the pass transistor N1 and the precharge transistor MX3 will be turned off.

Consequently, when the clock signal PHI2A in FIG. 2(d) drives the capacitor C207 from 0 volts to +3 volts at the time t1, the node M1 will also be pulled by the same 3 volts and will be at +3 volts. This causes a large voltage swing on the gate of the pass transistor N1, which is turned on hard so that the 0 volts at the input node "pmps" is passed to the output node CN1 without the loss of a threshold voltage drop from the pass transistor N1. As a result, the node CN1 will be pulled to 0 volts.

When the clock signal PHI2 in FIG. 2(d) goes back low at time t2, the node M1 is coupled low so as to turn off the pass transistor N1. Next, the clock signal PHI1 in FIG. 2(a) drives the gate of transistor MX3 high from 0 volts to +3 volts at time t3. This causes the node M1 to be the same as the node CN1 which assures that the pass transistor N1 is still turned off when the node CN1 is driven negative to −3 volts by the clock signal PHI2 going low from +3 volts to 0 volts at time t4. In this manner, the output node CN1 of the first stage has been pumped to −3 volts.

Subsequently, the second charge pump stage 202 will cause the output node CN2 to be pumped to a high negative potential (i.e., −4.5 volts) via the clock signals PHI1 and PHI1A. The remaining charge pump stages 203 through 206 serve to pump the negative potential even higher so that the output voltage at NEGP on the output line 222 will be approximately −9.5 volts.

It should be appreciated by those skilled in the art that the reduction of the body effect due to the use of N-channel intrinsic transistors in separate p-wells and the consequent reduction in the magnitude of threshold voltage makes possible operating the present pump circuit at lower supply voltages. Since the p-wells have to be equal or negative with respect to the source or drain junctions of the transistors in order to prevent forward biasing of the n+ to p-well junction diodes, proper biasing of the p-wells is essential to its operation. When the clock signal PHI2 swings low at time t4 in FIG. 2(b), it is capacitively coupled to the node CN3 causing it to decrease to a very negative level. Then, immediately afterwards, the clock signal PHI1A goes high at time t5 in FIG. 2(c), coupling the node M4 more positive which turns on the equalization transistor MPW0 so as to equalize the first p-well node connection area VPW0 to the negative voltage at the node CN3. Furthermore, the transistor N10, which is connected in a diode configuration, prevents the node CN3 from going more negative at about 0.3 V (the threshold voltage) below the first p-well connection area VPW0. The same applies for the diode-connected transistors N8 and N9 for the nodes CN1 and CN2, respectively. For the second p-well connection area MPW1, the equalization transistor VPW1 and the diode-connected transistors N11–N13 perform the same function as just previously described for the first p-well connection area VPW0.

From the foregoing detailed description, it can thus be seen that the present invention provides an improved low supply voltage negative charge pump for generating a relatively high negative voltage to control gates of selected memory cells via wordlines in an array of flash EEPROM memory cells during flash erasure. The negative charge pump of the present invention includes a plurality of charge pump stages and coupling capacitors coupled to each of the plurality of charge pump stages. Each of the plurality of charge pump stages is formed of an N-channel intrinsic pass transistor, an N-channel intrinsic initialization transistor, and an N-channel intrinsic pre-charge transistor. Further, the coupling capacitors are formed of p-well capacitors operating in the accumulation region.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A low supply voltage negative charge pump for generating a relatively high negative voltage to control gates of selected memory cells via wordlines in an array of flash EEPROM memory cells during flash erasure, said negative charge pump comprising:

clock means for generating a plurality of clock signals;

charge pumping means (210) responsive to an external power supply potential and to said plurality of clock signals for generating a relatively high negative voltage;

said charge pump means being formed of a plurality of charge pump stages (201–206);

coupling capacitor means (C201–C212) responsive to said plurality of clock signals and being coupled to each of said plurality of charge pump stages for delivering said plurality of clock signals to said plurality of charge pump stages;

each of said plurality of charge pump stages being formed of an N-channel intrinsic pass transistor (N1–N6), an N-channel intrinsic initialization transistor (MD1–MD6), and an N-channel intrinsic pre-charge transistor (MX3–MX7, MX1); and each of said N-channel intrinsic transistors (N1–N6; MD1–MD6; MX3–MX7, MX1) including an n-type source region (134) and an n-type drain region (136) formed in a D-well region (132) and a gate oxide layer (138) disposed between the top surface of said p-well region and a polysilicon gate (140), said p-well region being disposed in an n-well region (130) within a p-type substrate (128).

2. A low supply voltage negative charge pump as claimed in claim 1, wherein said N-channel intrinsic pass transistor (N1–N3), intrinsic initialization transistor (MD1–MD3), and intrinsic pre-charge transistors (M3X–M5X) in said first, second and third charge pump stages are formed in a first separate p-well which is connected to a p-well connection area (VPW0) so as to reduce the body-effect.

3. A low supply voltage negative charge pump as claimed in claim 2, wherein said N-channel intrinsic pass transistor (N4–N6), intrinsic initialization transistor (MD4–MD6), and intrinsic pre-charge transistor (MX6, MX7, MX1) in said fourth, fifth and sixth pump stages are formed in a second separate p-well which is connected to a p-well connection area (VPW1) so as to reduce the body-effect.

4. A low supply voltage negative charge pump as claimed in claim 1, wherein said external positive potential is approximately +3.0 volts or lower.

5. A low supply voltage negative charge pump as claimed in claim 1, wherein said relatively high negative voltage is approximately −9.5 volts.

6. A low supply voltage negative charge pump as claimed in claim 1, wherein said coupling capacitor means is formed of a plurality of accumulation capacitors.

7. A low supply voltage negative charge pump as claimed in claim 6, wherein each of said plurality of accumulation capacitors is formed of a p-well capacitor.

8. A low supply voltage negative charge pump as claimed in claim 7, wherein said p-well capacitor includes a pair of p+ electrode regions (116, 118), formed in a p-well region (114) within an n-well region (112) and a gate oxide layer (120) disposed between the top surface of said p-well region and a polysilicon gate (122), said n-well region being disposed in a p-type substrate (110).

9. A low supply voltage negative charge pump as claimed in claim 1, wherein said N-channel intrinsic pass transistor, intrinsic initialization transistor, and intrinsic pre-charge transistor in said first through sixth pump stages are formed in its own separate p-well so as to reduce the body-effect.

10. A low supply voltage negative charge pump for generating a relatively high negative voltage to control gates of selected memory cells via wordlines in an array of flash EEPROM memory cells during flash erasure, said negative charge pump comprising:

charge pumping means (210) responsive to an external power supply potential and to clock signals for generating a relatively high negative voltage;

said charge pump means being formed of a plurality of charge pump stages (201–206);

coupling capacitor means (C201–C212) responsive to said clock signals and being coupled to each of said plurality of charge pump stages for delivering said plurality of clock signals to said charge pump stages;

each of said plurality of charge pump stages being formed of an N-channel intrinsic pass transistor (N1–N6), an N-channel intrinsic initialization transistor (MD1–MD6), and an N-channel intrinsic pre-charge transistor (MX3–MX7, MX1); and each of said N-channel intrinsic transistors (N1–N6; MD1–MD6; MX3–MX7, MX1) including an n-type source region (134) and an n-type drain region (136) formed in a p-well region (132) and a gate oxide layer (138) disposed between the top surface of said p-well region and a polysilicon gate (140), said p-well region being disposed in an n-well region (130) within a p-type substrate (128).

11. A low supply voltage negative charge pump as claimed in claim 10, wherein said N-channel intrinsic pass transistor (N1–N3), intrinsic initialization transistor (MD1–MD3), and intrinsic pre-charge transistors (M3X–M5X) in said first, second and third charge pump stages are formed in a first separate p-well which is connected to a p-well connection area (VPW0) so as to reduce the body-effect.

12. A low supply voltage negative charge pump as claimed in claim 11, wherein said N-channel intrinsic pass transistor (N4–N6), intrinsic initialization transistor (MD4–MD6), and intrinsic pre-charge transistor (MX6, MX7, MX1) in said fourth, fifth and sixth pump stages are formed in a second separate p-well which is connected to a p-well connection area (VPW1) so as to reduce the body-effect.

13. A low supply voltage negative charge pump as claimed in claim 10, wherein said external positive potential is approximately +3.0 volts or lower.

14. A low supply voltage negative charge pump as claimed in claim 10, wherein said coupling capacitor means is formed of a plurality of accumulation capacitors.

15. A low supply voltage negative charge pump as claimed in claim 14, wherein each of said plurality of accumulation capacitors is formed of a p-well capacitor.

16. A low supply voltage negative charge pump as claimed in claim 15, wherein said p-well capacitor includes a pair of p+ electrode regions (116, 118), formed in a p-well region (114) within an n-well region (112) and a gate oxide layer (120) disposed between the top surface of said p-well region and a polysilicon gate (122), said n-well region being disposed in a p-type substrate (110).

17. A low supply voltage negative charge pump as claimed in claim 11, wherein said N-channel intrinsic pass transistor, intrinsic initialization transistor, and intrinsic pre-charge transistor in said first through sixth pump stages are formed in its own separate p-well so as to reduce the body-effect.

18. A low supply voltage negative charge pump for generating a relatively high negative voltage to control gates of selected memory cells via wordlines in an array of flash EEPROM memory cells during flash erasure, said negative charge pump comprising:

charge pumping means (210) responsive to an external power supply potential and to clock signals for generating a relatively high negative voltage;

said charge pump means being formed of a plurality of charge pump stages (201–206);

a plurality of accumulation capacitors (C201–C212) responsive to said clock signals and being coupled to a corresponding one of said plurality of charge pump stages for delivering said clock signals to said plurality of charge pump stages;

each of said plurality of charge pump stages being formed of an N-channel intrinsic pass transistor (N1–N6), an N-channel intrinsic initialization transistor (MD1–MD6), and an N-channel intrinsic pre-charge transistor (MX3–MX7, MX1); and each of said plurality of accumulation capacitors being formed of a p-well capacitor.

* * * * *

UNITED STATES PATENT AND TRADEMARK OFFICE
CERTIFICATE OF CORRECTION

PATENT NO : 5,973,979
DATED : October 26, 1999
INVENTOR(S): Chang K. Chung et al.

It is certified that error appears in the above-identified patent and that said Letters Patent is hereby corrected as shown below:

Column 7, line 31, charge "fourphase" to -- four-phase --

Column 9, line 22, change "D-well" to -- p-well --.

Signed and Sealed this

Twenty-third Day of May, 2000

Attest:

Q. TODD DICKINSON

*Attesting Officer*     *Director of Patents and Trademarks*